United States Patent
Lin et al.

(10) Patent No.: US 7,256,124 B2
(45) Date of Patent: Aug. 14, 2007

(54) METHOD OF FABRICATING SEMICONDUCTOR DEVICE

(75) Inventors: Keng-Chu Lin, Chaojhou Township, Pingtung County (TW); Yi-Chi Liao, Puli Township, Nantou County (TW); Hung-Chun Tsai, Hsinchu (TW); Yung-Cheng Lu, Taipei (TW); Hung-Wen Su, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 181 days.

(21) Appl. No.: 11/094,011

(22) Filed: Mar. 30, 2005

(65) Prior Publication Data
US 2006/0228856 A1   Oct. 12, 2006

(51) Int. Cl.
*H01L 21/44* (2006.01)
(52) U.S. Cl. ............... 438/672; 438/637; 438/640; 257/E21.585

(58) Field of Classification Search .................... None
See application file for complete search history.

(56) References Cited

U.S. PATENT DOCUMENTS 6,468,906 B1 * 10/2002 Chan et al. ................. 438/687
2005/0245096 A1 * 11/2005 Gates et al. ................ 438/778

OTHER PUBLICATIONS

Stanley Wolf, "Silicon Processing for the VLSI Era", 2002 by Lattice Press, vol. 4, pp. 770-772.*

* cited by examiner

*Primary Examiner*—Michael Lebentritt
*Assistant Examiner*—Cheung Lee
(74) *Attorney, Agent, or Firm*—Thomas, Kayden, Horstemeyer & Risley

(57) ABSTRACT

A method of fabricating a semiconductor device. A semiconductor substrate with a patterned conductive layer on a top surface of the substrate is first provided. A dielectric layer is then formed to cover the substrate. Thereafter, an electron beam irradiation procedure is performed to anneal the patterned conductive layer and reduce resistance of the patterned conductive layer.

12 Claims, 1 Drawing Sheet

METHOD OF FABRICATING SEMICONDUCTOR DEVICE

BACKGROUND

The invention relates to a semiconductor technology, and more particularly, to a method of fabricating a semiconductor device by electron beam annealing.

In semiconductor fabrication, interconnect structures are typically formed in the back end of line (BEOL) to connect a plurality of electric devices. As integrated circuits (ICs) are scaled down to deep submicron regime, RC delay becomes increasingly dominant over intrinsic gate delay. To solve this issue, two realistic methods are popularly accepted. One is the use of copper as the conductor for multilevel interconnects to decrease the resistance parts of RC delay. Another is the use of a low dielectric constant material to reduce coupling capacitance between metal lines.

In a conventional semiconductor device fabrication process, the interconnect structure is annealed by a thermal process to reduce a resistance of the interconnect structure. Normally, the thermal annealing process must be carried out at relatively high temperatures, such as 800 to 1200° C., leading to a serious impact on other portions of the semiconductor devices. For example, some dopants may diffuse because of a concentration gradient during the high temperature annealing process, seriously deteriorating electric performance of the semiconductor devices. In addition, the interconnect structure may not be well annealed, particularly tinny conductive lines. Additionally, the annealing efficiency varies with different dimensions.

Thus, a method of fabricating a semiconductor device with a reduced thermal process is desirable.

SUMMARY

In an exemplary embodiment of a method of fabricating a semiconductor device, a semiconductor substrate with a patterned conductive layer on the top surface of the substrate is first provided. A dielectric layer is then formed to cover the substrate. Thereafter, electron beam irradiation is performed to anneal the patterned conductive layer and reduce a resistance of the patterned conductive layer.

In an exemplary embodiment of a method of fabricating a semiconductor device, a substrate is first provided. A first dielectric layer is formed on the substrate and then patterned to form a first pattern in the first dielectric layer. A conductive layer is formed on the first dielectric layer and filled into the first pattern in the first dielectric layer. A planarization process is performed to remove a part of the conductive layer over a top surface of the first dielectric layer. A cap layer, such as a second dielectric layer is disposed on the first dielectric layer and the conductive layer. Thereafter, electron beam irradiation is performed to anneal the conductive layer and reduce a resistance of the patterned conductive layer.

DESCRIPTION OF THE DRAWINGS

The invention can be more fully understood by reading the subsequent detailed description and examples with references made to the accompanying drawings, wherein.

DETAILED DESCRIPTION

The invention provides a method of fabricating a semiconductor device with an interconnect structure. As will be described in detail here, some embodiments of a semiconductor device have a patterned conductive layer. It is noted that the "patterned conductive layer" is only represented for clarity. In practice, the patterned conductive layer can be any kind of interconnect structure, such as contacts, plugs, vias, conductive lines, dual damascene structures, or multi-layer interconnects comprising aforementioned structures. In the same manner, the patterns in the dielectric layer represents all kinds of opening structure, such as trenches, holes, channels, or combinations thereof, for accommodating the contact plugs, vias, or conductive lines. In addition, descriptions of other parts of the semiconductor device are omitted as they are known to those skilled in the art and are not directly related.

Figure 1:
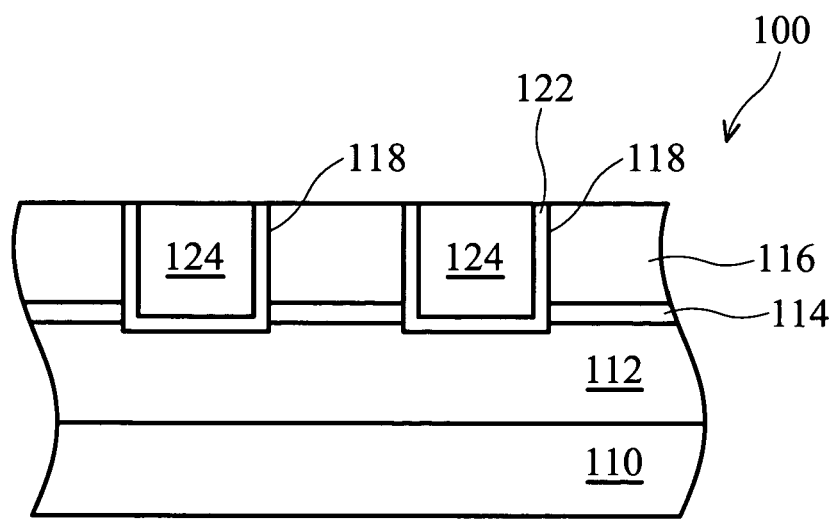
FIGS. 1 to 2 are schematic diagrams of an embodiment of a method of fabricating a semiconductor device.
Figure 2:
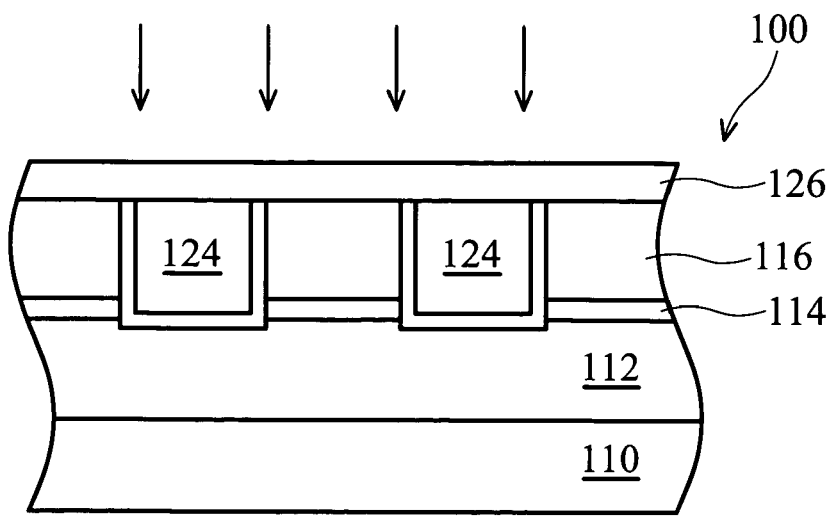

FIGS. 1 to 2 are schematic diagrams of an embodiment of a method of fabricating a semiconductor device 100. As shown in FIG. 1, a substrate 110 is first provided. A first dielectric layer 112 and a second dielectric layer 116 are formed on the substrate 110 in sequence. Preferably, the method further comprises forming an optional etching stop layer 114 interposed the first dielectric layer 112 and the second dielectric layer 116.

In an embodiment, each first dielectric layer 112 and second dielectric layer 116 comprise a low dielectric constant material, such as diamond-like carbon and serves as an interlayer dielectric (ILD) layer or inter-metal dielectric (IMD) layer. The etching stop layer 114 has an excellent etching selectivity over the first dielectric layer 112 and the second dielectric layer 116 for precisely controlling depth or operation time of a subsequent etching process.

A patterning process is then performed to leave a first pattern 118 in the second dielectric layer 116. In an embodiment of the invention, the patterning process is an anisotropic etching process. As previously mentioned, a depth of the anisotropic etching process is precisely controlled by differences in etching rates between the etching stop layer 114 and the first dielectric layer 112 and the second dielectric layer 116. The first pattern 118 comprises a trench, contact hole, channel, dual damascene opening comprising a trench portion and a via portion, or a combination thereof for accommodating an interconnect structure.

Thereafter, a conductive layer 124 is formed on the second dielectric layer 116 and filled into the first pattern 118 in the second dielectric layer 116. In an embodiment, the conductive layer 124 comprises aluminum, aluminum alloys, copper, copper alloys, tantalum, tungsten, titanium, platinum, nickel, or a combination thereof. Preferably, the conductive layer 124 comprises copper or copper alloys. The conductive layer 124 can be formed by plasma vapor deposition (PVD), chemical vapor deposition (CVD), atomic layer deposition (ALD), or electro chemical process (ECP).

In another embodiment, the method further comprises a step of forming a barrier layer 122 before forming the conductive layer 124 for reducing a diffusion level of the conductive layer 124. The barrier layer 122 comprises Ta, TaN, Ti, TiN, or a combination thereof.

A planarization process, such as a CMP process, is then performed to remove a part of the conductive layer 124 over a top surface of the second dielectric layer 116. Thus, only a part of the patterned conductive layer 124 remains in the first pattern 118 in the second dielectric layer 116.

As shown in FIG. 2, an optional cap layer 126, such as a third dielectric layer, is deposited on the second dielectric layer 116 and the patterned conductive layer 124. In an embodiment of the invention, the cap layer 126 has a thickness of 300 to 1000 angstroms and comprises silicon oxide, silicon nitride, silicon carbide, or a combination thereof.

Electron beam irradiation is then performed to anneal the patterned conductive layer 124 and reduce a sheet resistance ($R_s$) of the patterned conductive layer 124. According to the experimental result, 5 to 15% sheet resistance ($R_s$) of the patterned conductive layer 124 can be reduced. During the electron beam irradiation procedure, a plurality of electron beams with output energy of 1 to 10 KeV are generated and output toward the patterned conductive layer 124, as illustrated by the arrows in FIG. 2. Note that the cap layer 126 serves as a protective layer to prevent damage to the patterned conductive layer 124 from the electron beam irradiation. In an embodiment of the invention, the cap layer 126 may be another etching stop layer. Furthermore, another interconnect structure (not shown) or patterned conductive layer (not shown) can be formed thereon by repeating the steps shown in FIGS. 1-2 to form a multi-layer interconnect structure.

In comparison with the related art technology, the method of the invention employs electron beam irradiation to anneal a patterned conductive layer. Thus, problems caused by the conventional thermal annealing process can be solved and reliability and electrical performance of the semiconductor device is improved. Furthermore, the electron beam annealing not only effectively reduces resistance but also provides an excellent sheet resistance uniformity of the conductive layer for different dimensions.

While the invention has been described by way of example and in terms of preferred embodiment, it is to be understood that the invention is not limited thereto.

What is claimed is:

1. A method of fabricating a semiconductor device, comprising:
    providing a semiconductor substrate with a patterned conductive layer on a top surface of the semiconductor substrate;
    forming a cap layer over the patterned conductive layer; and
    performing an electron beam irradiation to anneal the patterned conductive layer, wherein the cap layer serves as a protective layer to prevent the patterned conductive layer from being damaged in the electron beam irradiation.

2. The method as claimed in claim 1 wherein the patterned conductive layer is a metal interconnect structure.

3. The method as claimed in claim 1 wherein the patterned conductive layer comprises aluminum, aluminum alloys, copper, copper alloys, tantalum, tungsten, titanium, platinum, nickel, or a combination thereof.

4. The method as claimed in claim 1 wherein the output energy of the electron beams is 1 to 10 KeV.

5. The method as claimed in claim 1 wherein the cap layer has a thickness of 300 to 1000 angstroms.

6. The method as claimed in claim 1 wherein the electron beam irradiation is used to reduce resistance of the patterned conductive layer.

7. A semiconductor device fabricated according to the method as claimed in claim 1.

8. A method of fabricating a semiconductor device, comprising:
    providing a substrate;
    forming a first dielectric layer on the substrate;
    patterning the first dielectric layer to form a first pattern in the first dielectric layer;
    forming a conductive layer on the first dielectric layer, the conductive layer filling the first pattern in the first dielectric layer;
    performing a planarization process to remove a part of the conductive layer over a top surface of the first dielectric layer;
    forming a cap layer on the first dielectric layer and the conductive layer; and
    performing an electron beam irradiation procedure to anneal the conductive layer, wherein the cap layer serves as a protective layer to prevent the conductive layer from being damaged by the electron beam irradiation.

9. The method as claimed in claim 8 wherein the conductive layer comprises aluminum, aluminum alloys, copper, copper alloys, tantalum, tungsten, titanium, platinum, nickel, or a combination thereof.

10. The method as claimed in claim 8 wherein the output energy of the electron beams is 1 to 10 KeV.

11. The method as claimed in claim 8 wherein the cap layer has a thickness of 300 to 1000 angstroms.

12. The method as claimed in claim 8 wherein the electron beam irradiation is used to reduce resistance of the conductive layer.

* * * * *